United States Patent
Chen et al.

(10) Patent No.: US 6,194,307 B1
(45) Date of Patent: Feb. 27, 2001

(54) ELIMINATION OF COPPER LINE DAMAGES FOR DAMASCENE PROCESS

(75) Inventors: Ying-Ho Chen, Taipei; Syun-Ming Jang, Hsin-Chu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/298,930

(22) Filed: Apr. 26, 1999

(51) Int. Cl.[7] .................................................. H01L 21/4763
(52) U.S. Cl. ............................................................. 438/626
(58) Field of Search ..................................... 438/626, 597, 438/669, 680, 687, 696, 692

(56) References Cited

U.S. PATENT DOCUMENTS

| | | | |
|---|---|---|---|
| 5,451,551 | 9/1995 | Krishnan et al. | 437/241 |
| 5,614,765 | 3/1997 | Avanzino et al. | 257/774 |
| 5,693,563 | 12/1997 | Teong | 437/190 |
| 5,731,245 | 3/1998 | Joshi et al. | 438/705 |
| 5,741,626 | 4/1998 | Jain et al. | 430/314 |
| 5,744,376 | 4/1998 | Chan et al. | 437/190 |
| 5,960,320 | * 9/1999 | Park | 438/688 |

* cited by examiner

*Primary Examiner*—David Nelms
*Assistant Examiner*—Quoc Hoang
(74) *Attorney, Agent, or Firm*—George O. Saile; Stephen B. Ackerman

(57) ABSTRACT

After the first layer of copper has been deposited and polished (to form the pattern of copper damascene conducting lines) a layer of Ta or TaN/Cu is deposited. Another thin layer of copper is deposited thereby filling existing pores and recesses in the polished copper lines. A second CMP is applied to the surface of the second deposited layer of copper, this second CMP removes the redundant copper from the space where the Inter Metal Dielectric (IMD) layer will be created. Prior to the deposition of the second layer of copper, a (brief) etchback of the (surface of the) first layer of copper can be performed in order to enhance copper surface integrity and thereby improve the deposition of the second layer of copper. A layer of TaN/Ta and a layer of seed copper can be deposited within the openings for the damascene conducting lines prior to the deposition of these lines.

20 Claims, 2 Drawing Sheets

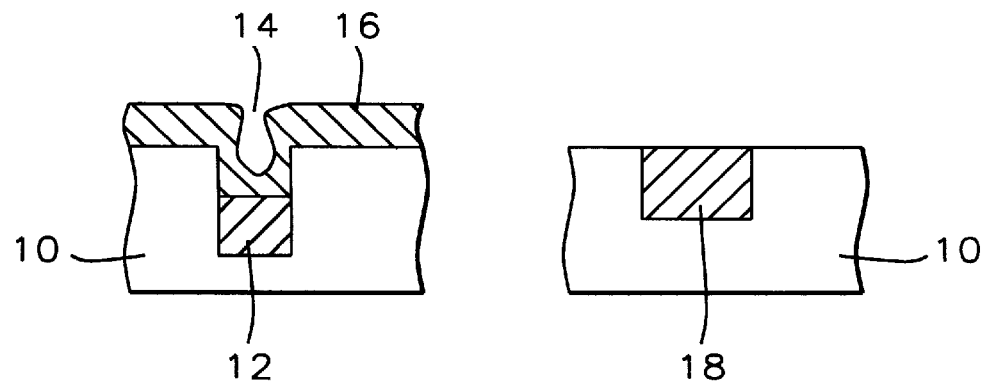
FIG. 1a *Prior Art*   FIG. 1b *Prior Art*
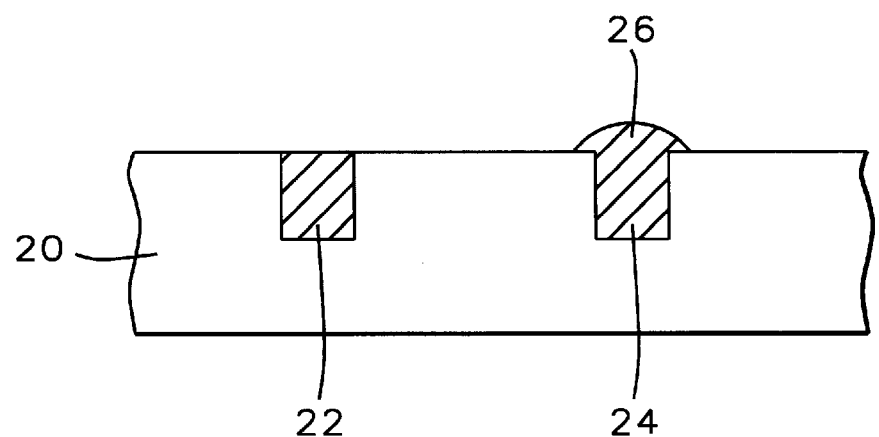
FIG. 2a *Prior Art*   FIG. 2b *Prior Art*

ELIMINATION OF COPPER LINE DAMAGES FOR DAMASCENE PROCESS

BACKGROUND OF THE INVENTION (1) Field of the Invention

The invention relates to the fabrication of semiconductor circuit devices, and, more particularly, to a method of avoiding copper line damages that are associated with copper line Chemical Mechanical Polishing (CMP).

(2) Description of the Prior Art

The present invention relates to the creation of conductive lines and vias that provide the interconnection of integrated circuits in semiconductor devices and/or the interconnections in a multilayer substrate on which semiconductor device(s) are mounted. The present invention specifically relates to the fabrication of conductive lines and vias by a process known as damascene.

The Damascene process has been demonstrated on a number of applications. The most commonly applied process is first metal or local interconnects. Some early Damascene structures have been achieved using Reactive Ion Etching (RIE) but Chemical Mechanical Planarization (CMP) is used exclusively today. Metal interconnects using Damascene of copper and of aluminum is also being explored.

U.S. Pat. No. 5,614,765 teaches that, in fabricating very and ultra large-scale integration (VLSI and ULSI) circuits with the dual damascene process, an insulating or dielectric material, such as silicon oxide, of a semiconductor device is patterned with several thousand openings for the conductive lines and vias. These openings are filled at the same time with metal, such as aluminum or copper, and serve to interconnect the active and/or passive elements of the integrated circuit. The dual damascene process also is used for forming the multilevel conductive lines of metal, such as copper, in the insulating layers, such as polyimide, of multi-layer substrates on which semiconductor devices are mounted.

Damascene therefore is an interconnection fabrication process in which grooves are formed in an insulating layer and filled with metal to form the conductive lines. Dual damascene is a multi-level interconnection process in which, in-addition to forming the grooves of single damascene, conductive via openings are also formed. In the standard dual damascene process, the insulating layer is coated with a photoresist which is exposed through a first mask with an image pattern of the via openings, the pattern is anisotropically etched in the upper half of the insulating layer. The photoresist now is exposed through a second mask with an image pattern of the conductive line openings, after being aligned with the first mask pattern to encompass the via openings. In anisotropically etching the openings for the conductive lines in the upper half of the insulating material, the via openings already present in the upper half are simultaneously etched and replicated in the lower half of the insulating material. After the etching is complete, both the vias and line openings are filled with metal. Dual damascene is an improvement over single damascene because it permits the filling of both the conductive grooves and vias with metal at the same time, thereby eliminating process steps. Although this standard damascene process offers advantages over other processes for forming interconnections, it has a number of disadvantages. It requires two masking steps to form the pattern, first for the vias and subsequently for the conductive lines. Furthermore, the edges of the via openings in the lower half of the insulating layer, after the second etching, are poorly defined because of the two etchings. In addition, since alignment of the two masks is critical in order for the pattern for the conductive lines to be over the pattern of the vias, a relatively large tolerance is provided and the vias do not extend the full width of the conductive line.

The application of the Damascene process continues to gain wider acceptance, most notably in the process of copper metalization due to the difficulty of copper dry etch where the Damascene plug penetrates deep in very small, sub-half micron, Ultra Large Scale integrated devices. Recent applications have successfully used copper as a conducting metal line, most notably in the construct of CMOS 6-layer copper metal devices. Even for these applications however, the wolfram plug was still used for contact points in order to avoid damage to the devices.

FIG. 1a shows Prior Art problems encountered when filling a Damascene copper plug 12 with copper 16. The plug 12 can be formed in a dielectric layer 10. A void 14 can develop above the opening of a Damascene plug 12 if the opening is relatively narrow and deep, a design characteristic that becomes more common with smaller semiconductor devices. This void 14 is caused by the difficulty experienced in having deep penetrating flow of the copper within the narrow opening. For a shallow or relatively wide plug 18, FIG. 1b, these problems are not experienced. Void 14 (FIG. 1a) also causes planarization problems during subsequent processing steps and can create a reliability issue.

FIG. 2 shows a Prior Art blanket deposition of metal within the hole 22, hole 22 can be formed in dielectric 20. Where the hole 22 is relatively shallow and wide, no problems of deposition are experienced, see FIG. 2a. This blanket deposition requires polish back, in the absence of polish back problems of shorts between metal lines arises caused by remaining metal on top of the surface. FIG. 2b demonstrates another Prior Art approach where the top 26 of the plug 24 is further extended by overfill. The extension 26 can be obtained by depositing a layer of copper across the surface and applying an etchback to that layer such that copper is left in place around the top of the plug.

In short, Prior Art experiences problems in creating a plug for the Damascene process that provides a reliable connect. In filling deep or narrow holes, problems of metal voids can arise. This in turn causes problems with planarization of subsequent layers that are deposited over the Damascene plug since these layers may now be deposited on a surface of poor planarity.

In overfilling a shallow hole, a polish-back is required in order to avoid shorts by leftover materials between metal lines. Polish-back further complicates the process and adds to the expense incurred while in many instances polishing has to be done in combination with buffing in order to obtain acceptable planarization.

While copper has become important for the creation of multilevel interconnections, copper lines frequently show damage after CMP and clean. This in turn causes problems with planarization of subsequent layers that are deposited over the copper lines since these layers may now be deposited on a surface of poor planarity. Isolated copper lines or copper lines that are adjacent to open fields are susceptible to damage. While the root causes for these damages are at this time not clearly understood, poor copper gap fill together with subsequent problems of etching and planarization are suspected. Where over-polish is required, the problem of damaged copper lines becomes even more severe.

U.S. Pat. No. 5,451,551 (Kishnan et al.) shows a TiW layer over a Cu damascene structure.

U.S. Pat. No. 5,731,245 (Joshi et al.) shows a CuGe hard cap over a Cu plug and CMP process. However, this reference differs from the invention.

U.S. Pat. No. 5,741,626 (Jain et al.) shows a Cu dual damascene structure.

U.S. Pat. No. 5,744,376 (Chan et al.) shows a barrier layer over a Cu interconnect.

U.S. Pat. No. 5,693,563 (Teong) shows a TiN layer over a Cu dual damascene structure.

SUMMARY OF THE INVENTION

It is the primary objective of the invention to eliminate damascene copper lines that are damaged after planarization.

It is another objective of the invention to facilitate the creation of copper lines using the damascene process.

It is another objective of the invention to eliminate damascene copper line voids and recesses after planarization.

It is another objective of the invention to eliminate poor gap filling of damascene copper lines.

It is another objective of the invention to eliminate the corrosion effect of copper slurry on damascene copper lines.

It is another objective of the invention to eliminate the corrosion effect of oxide slurry on damascene copper lines.

It is another objective of the invention to eliminate the corrosion effect of post clean operations on damascene copper lines.

It is another objective of the invention to provide a method to reduce wafer scrapping due to damascene copper line damage by providing a method of re-working damaged damascene copper lines.

In accordance with the above stated objectives, the present invention teaches, after the CMP of damascene copper line (the first copper deposition) has been completed, to deposit a layer of Ta or TaN/Cu. This layer of Ta or TaN/Cu serves to prevent diffusion between copper layers. Another layer of copper is deposited (the second copper deposition) thereby filling existing pores and recesses in the polished copper lines. A second CMP is applied to the surface of the second deposited layer of copper, this second CMP removes the redundant copper from the space where the Inter Metal Dielectric (IMD) layer will be created. Prior to the deposition of the second layer of copper, a (brief) etchback of the (surface of the) first layer of copper can be performed in order to enhance copper surface integrity and thereby improve the deposition of the second layer of copper.

BRIEF DESCRIPTION OF THE DRAWINGS

FIG. 1a shows a Prior Art damascene plug with surface irregularities.

FIG. 1b shows a Prior Art damascene plug without surface irregularities.

FIG. 2a shows a Prior Art solution to damascene plug irregularities.

FIG. 2b shows another Prior Art solution to damascene plug irregularities.

DESCRIPTION OF THE PREFERRED EMBODIMENT

Figure 3:
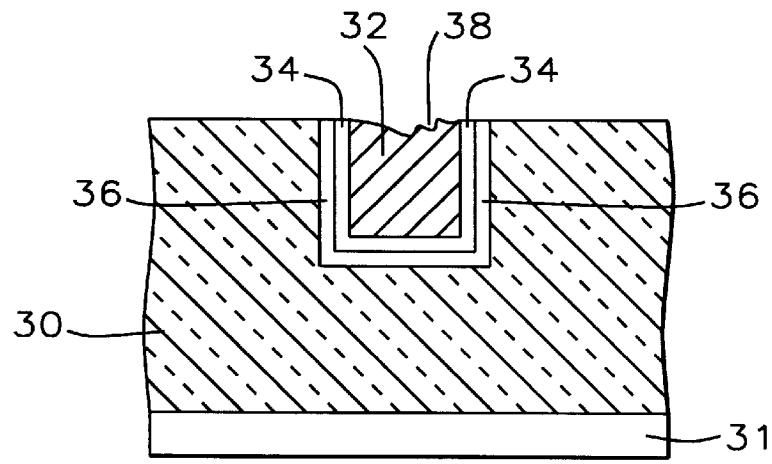
FIG. 3 shows the cross-section of a damascene conducting line that is filled with copper into which a thin barrier and seed copper have been deposited prior to the formation of the damascene conducting line.

Referring now specifically to FIG. 3, there is shown a cross section of the damascene conducting line 32 that has been formed in a dielectric layer 30. Layer 30 is typically deposited on the surface of a semiconductor substrate 31. Prior to the formation of the damascene conducting line 32 a thin layer 36 of TaN/Ta has been deposited over the inside of the opening for the damascene conducting line, thereby covering the bottom and the sidewalls of this opening. This layer 36 of TaN/Ta prevents diffusion of the copper of conducting line 32 into the surrounding dielectric 30 during the formation of the copper conducting line 32. Layer 36 typically has a thickness of about 300 Angstrom.

Also shown is the deposition of a layer 34 of seed copper, this seed copper facilitates and enhances the formation of the copper conducting line 32 during its deposition. Layer 34 typically has a thickness of about 1600 Angstrom.

It is apparent from the profile of the surface 38 of conducting line 32 that this surface has extensive irregularities and therefore forms a poor surface for the formation of subsequent layers within the construction of the semiconductor device. The irregularities within the profile of surface 38 typically extend into the surface of the conducting line 32 no more than 1000 Angstrom.

FIG. 2 shows a cross section of the damascene conducting line 32 after a thin film 40 of copper has been deposited over the surface of the damascene conducting line 32 whereby this deposition extends beyond the surface of conducting line 32 and over the surface of the surrounding intra-level dielectric 30. Prior to the deposition of this layer 40 a short etchback of the surface of the copper conducting line 32 may have been performed. This etchback removes surface Electro Chemical Plating (ECP) copper and therefore enhances the deposition of the thin copper film 40. Layer 40 typically is between about 500 and 1000 Angstrom thick. Also prior to the deposition of layer 40 a thin barrier of TaN/Cu or Ta can be deposited (not shown) across the surface of copper conducting line 32. This layer of TaN/Cu or Ta typically is between about 200 and 500 Angstrom thick. This barrier prevents the diffusion of thin layer 40 into the copper conducting line 32, such a diffusion would be counteractive to the objectives of the invention. As etch stop for the removal of the ECP copper can be used TaN, Ta and USG.

Figure 4:
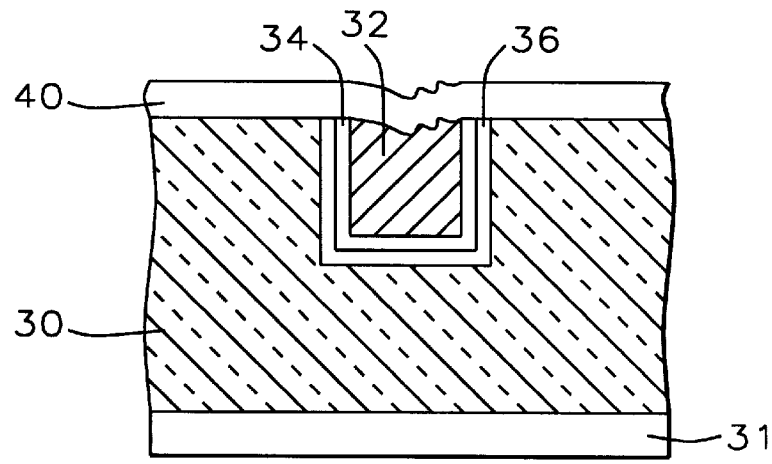
FIG. 4 shows the damascene conducting line of FIG. 3 over which a thin layer of copper has been deposited.
Figure 5:
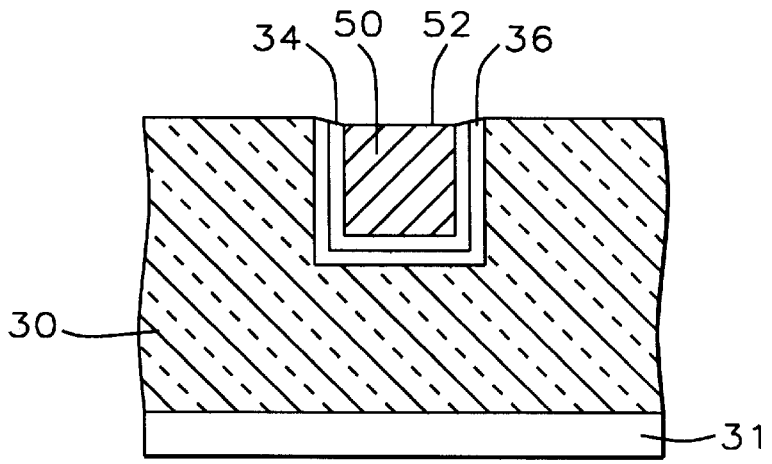
FIG. 5 shows the damascene conducting line of FIG. 4 after the thin layer of copper has been polished.

FIG. 5 shows a cross section of the damascene conducting line 50 after the second process of polishing the surface of the conducting line 50 has been completed. As a result of the second CMP the profile 52 of the surface of the damascene conducting line 50 exhibits excellent planarity. It is clear that, where the original irregularities within the profile of the surface of the damascene conducting line form deep indents into this surface, the second CMP will not remove all of the TaN/Cu or Ta that was deposited onto this surface prior to the deposition of the thin layer of copper (layer 40, FIG. 4). The deposition of the thin layer of copper (layer 40, FIG. 4) is typically done using Physical Vapor Deposition (PVD) or Ion Metal Plasma (IMP) techniques. This PVD or IMP process, applied to the surface of the copper conducting line, combined with the remaining TaN/Cu or Ta on the surface of the copper conducting line, create a surface of conducting line 50 that is of higher quality and better suited to prevent the effects of chemical elements (chemical attack) that may come in contact with this surface.

The CMP of the thin film (the second CMP) can go below the original level of the surface of the dielectric. This etchback can penetrate between about 500 and 2000 Angstrom, as etch stop for this etchback can be used TaN, Ta and USG.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming copper damascene conducting lines on the surface of a semiconductor substrate, a layer of intra-level dielectric having been deposited on the surface of said substrate with a pattern of copper damascene conducting lines created within the layer of intra-level dielectric, said layer of intra-level dielectric having a partially exposed surface, said pattern of copper damascene conducting lines comprising a barrier layer of TaN/Ta having a thickness within the range of between 150 and 500 Angstrom in addition to a seed layer of copper having a thickness within the range of between 1000 and 2200 Angstrom, said barrier and seed layers to be formed between sidewalls and bottom of holes for said pattern in said intra-level dielectric and sidewalls and bottom of said pattern of copper damascene conducting lines, said pattern of copper damascene conducting lines having been polished by applying methods of Chemical Mechanical Polishing, said method comprising the steps of:

depositing a layer of Ta or TaN/Cu over said pattern of copper damascene conducting lines, said depositing to include said partially exposed surface of said intra-level dielectric;

depositing a thin layer of copper to a thickness between about 1000 and 3000 Angstrom over said layer of Ta or TaN/Cu; and polishing said thin layer of copper by applying methods of Chemical Mechanical Polishing.

2. The method of claim 1 wherein said depositing a thin layer of copper over said pattern of copper damascene conducting lines is a Physical Vapor Deposition process.

3. The method of claim 1 wherein said depositing a thin layer of copper over said pattern of copper damascene conducting lines is an Ion Metal Plasma process.

4. The method of claim 1 wherein said depositing a thin layer of copper over said pattern of copper damascene conducting lines is a Chemical Vapor Deposition process.

5. The method of claim 1 with the additional step of performing a short etchback to the surface of said pattern of copper damascene conducting lines said etchback to occur prior to said depositing a layer of Ta or TaN/Cu over said pattern of copper damascene conducting lines.

6. The method of claim 1 wherein said polishing said thin layer of copper is polishing said thin layer of copper down to the top surface of said layer of intra-level dielectric.

7. The method of claim 1 wherein said polishing said thin layer of copper is polishing to proceed to below the original top surface of said pattern of copper damascene conducting lines and to remove the top layer of said pattern of copper damascene conducting lines thereby furthermore to remove the top surface of said intra-level dielectric.

8. A method for forming copper damascene conducting lines on the surface of a semiconductor, comprising the steps of:

providing a semiconductor substrate;

depositing a layer of dielectric over the surface of said substrate;

patterning and etching said layer of dielectric thereby forming a pattern of intra-level dielectric for said copper damascene conducting lines;

depositing and planarizing said copper damascene conducting lines, said planarizing of said damascene conducting lines to be performed using methods of Chemical Mechanical Polishing;

depositing a thin layer of Ta or TaN/Cu on the surface of said pattern of copper damascene conducting lines;

depositing a thin layer of copper over said layer of Ta or TaN/Cu, said thin layer of copper to be deposited to a thickness between about 1000 and 3000 Angstrom; and polishing said thin layer of copper, using methods of Chemical Mechanical Polishing.

9. The method of claim 8 with the additional step of performing a short etch back of the surface of said copper damascene conducting lines, said additional step to be performed prior to said depositing a thin layer of copper over said copper damascene conducting lines.

10. The method of claim 8 wherein said depositing a thin layer of copper is a Physical Vapor Deposition process.

11. The method of claim 8 wherein said depositing a thin layer of copper is an Ion Metal Plasma process.

12. The method of claim 8 wherein said depositing a thin layer of copper is a Chemical Vapor Deposition process.

13. The method of claim 8 wherein said polishing said thin layer of copper is polishing said thin layer of copper down to the top surface of said intra-level dielectric.

14. The method of claim 8 wherein said polishing said thin layer of copper is polishing to below the original top surface of said copper damascene conducting lines thereby removing the top layer of said copper damascene conducting lines thereby furthermore removing the top surface of said intra-level dielectric.

15. A method for forming copper damascene conducting lines on the surface of a semiconductor substrate, a layer of intra-level dielectric having been deposited on the surface of said substrate with a pattern of copper damascene conducting lines created within the layer of intra-level dielectric, said pattern of copper damascene conducting lines having been polished by applying methods of Chemical Mechanical Polishing, comprising the steps of:

performing a short etch back of the surface of said copper damascene conducting lines;

depositing a layer of Ta or TaN/Cu on the surface of said pattern of copper damascene conducting lines thereby including the surface of said intra-level dielectric;

depositing a thin layer of copper to a thickness of between 1000 and 3000 Angstrom over said layer of Ta or TaN/Cu; and polishing said thin layer of copper.

16. The method of claim 15 wherein said depositing a thin layer of copper is a Physical Vapor Deposition process.

17. The method of claim 15 wherein said depositing a thin layer of copper is an Ion Metal Plasma process.

18. The method of claim 15 wherein said depositing a thin layer of copper is a Chemical Vapor Deposition process.

19. The method of claim 18 wherein said polishing said thin layer of copper is polishing said thin layer of copper down to the top surface of said intra-level dielectric.

20. The method of claim 15 wherein said polishing said thin layer of copper is polishing to below the original top surface of said copper damascene conducting lines thereby removing the top layer of said copper damascene conducting lines thereby furthermore removing the top surface of said intra-level dielectric.

* * * * *